United States Patent
Hegblom (10) Patent No.: US 11,340,290 B2
(45) Date of Patent: May 24, 2022

(54) TEMPERATURE CONTROL FOR BOTTOM-EMITTING WAFER-LEVEL VERTICAL CAVITY SURFACE EMITTING LASER TESTING

(71) Applicant: Lumentum Operations LLC, San Jose, CA (US)

(72) Inventor: Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/915,246

(22) Filed: Jun. 29, 2020

(65) Prior Publication Data

US 2021/0223310 A1    Jul. 22, 2021

Related U.S. Application Data (60) Provisional application No. 62/963,679, filed on Jan. 21, 2020.

(51) Int. Cl.
| | | |
|---|---|---|
| G01R 31/28 | (2006.01) | |
| G01R 31/44 | (2020.01) | |
| H01S 3/04 | (2006.01) | |
| H01S 5/42 | (2006.01) | |
| H01S 5/183 | (2006.01) | |
| H01S 5/00 | (2006.01) | |

(52) U.S. Cl.
CPC ......... *G01R 31/2891* (2013.01); *G01R 31/44* (2013.01); *H01S 3/04* (2013.01); *H01S 3/0405* (2013.01); *H01S 5/0042* (2013.01); *H01S 5/183* (2013.01); *H01S 5/18305* (2013.01); *H01S 5/423* (2013.01)

(58) Field of Classification Search
CPC ................ G01R 31/2891; G01R 31/44; G01R 31/2886; G01R 31/2874; G01R 31/2875; G01R 31/2862; H01S 5/423; H01S 5/183; H01S 5/18305; H01S 3/0405; H01S 5/0042

See application file for complete search history.

(56) References Cited

U.S. PATENT DOCUMENTS

| | | | | |
|---|---|---|---|---|
| 2013/0163627 A1* | 6/2013 | Seurin | ................. | H01S 5/02469 372/36 |
| 2016/0336717 A1* | 11/2016 | Lin | ......................... | H01S 5/423 |
| 2021/0156903 A1* | 5/2021 | Chuang | .............. | G01R 31/2635 |

* cited by examiner

Primary Examiner — Jermele M Hollington
Assistant Examiner — Suresh K Rajaputra
(74) Attorney, Agent, or Firm — Harrity & Harrity, LLP (57) ABSTRACT

A testing device may include a stage associated with holding an emitter wafer during testing of an emitter. The stage may be arranged such that light emitted by the emitter passes through the stage. The testing device may include a heat sink arranged such that the light emitted by the emitter during the testing is emitted in a direction away from the heat sink, and such that a first surface of the heat sink is near a surface of the emitter wafer during the testing but does not contact the surface of the emitter wafer. The testing device may include a probe card, associated with performing the testing of the emitter, that is arranged over a second surface of the heat sink such that, during the testing of the emitter, a probe of the probe card contacts a probe pad for the emitter through an opening in the heat sink.

20 Claims, 5 Drawing Sheets

TEMPERATURE CONTROL FOR BOTTOM-EMITTING WAFER-LEVEL VERTICAL CAVITY SURFACE EMITTING LASER TESTING

CROSS-REFERENCE TO RELATED APPLICATION

This patent application claims priority to U.S. Provisional Patent Application No. 62/963,679, filed on Jan. 21, 2020, and entitled "TEMPERATURE CONTROL FOR BOTTOM EMITTING WAFER-LEVEL VERTICAL-CAVITY SURFACE-EMITTING LASER TESTING." The disclosure of the prior application is considered part of and is incorporated by reference into this patent application.

TECHNICAL FIELD

The present disclosure relates generally to wafer level testing for an emitter array and, more particularly, to wafer level testing for an emitter array with improved temperature control.

BACKGROUND

Some types of emitter wafers, such as vertical-cavity surface emitting laser (VCSEL) wafers, facilitate testing of individual emitters at the wafer level. This is in contrast with edge-emitting lasers (e.g., Fabry-Perot lasers, Bragg laser, distributed feedback (DFB) lasers, or the like), which need to be cut from the emitter wafer and have edges polished before testing is possible. Wafer level testing reduces production costs by eliminating a need to expend resources on emitters that are later identified (e.g., after cutting and polishing) as defective or otherwise unusable.

SUMMARY

According to some implementations, a testing device may include: a stage associated with holding a bottom-emitting vertical-cavity surface-emitting laser (VCSEL) wafer during testing of an emitter of the bottom-emitting VCSEL wafer, wherein the stage is arranged such that light emitted by the emitter during the testing passes through the stage; a heat sink for the bottom-emitting VCSEL wafer during the testing of the emitter, wherein the heat sink is arranged such that the light emitted by the emitter during the testing is emitted in a direction away from the heat sink, and wherein the heat sink is arranged such that a first surface of the heat sink is near a surface of the bottom-emitting VCSEL wafer during the testing but does not contact the surface of the bottom-emitting VCSEL wafer; and a probe card associated with performing the testing of the emitter, wherein the probe card is arranged over a second surface of the heat sink such that, during the testing of the emitter, a probe of the probe card contacts a probe pad for the emitter through an opening in the heat sink.

According to some implementations, a method may include placing a bottom-emitting VCSEL wafer on a stage associated with holding the bottom-emitting VCSEL wafer during testing of an emitter of the bottom-emitting VCSEL wafer, wherein the bottom-emitting VCSEL wafer is placed such that light to be emitted by the emitter during the testing is to pass through the stage; arranging the stage such that a first surface of a heat sink is near a surface of the bottom-emitting VCSEL wafer but does not contact the surface of the bottom-emitting VCSEL wafer, wherein the stage is arranged such that the light emitted by the emitter during the testing is to be emitted in a direction away from the heat sink; and performing the testing of the emitter using a probe card having a probe that contacts a probe pad for the emitter through an opening in the heat sink.

According to some implementations, a device may include: a heat sink for an emitter wafer during testing of an emitter of the emitter wafer, wherein the heat sink is arranged such that light emitted by the emitter during the testing is emitted in a direction away from the heat sink, and wherein the heat sink is arranged such that a first surface of the heat sink is near a surface of the emitter wafer during the testing but does not contact the surface of the emitter wafer; and a probe card associated with performing the testing of the emitter, wherein the probe card is arranged over a second surface of the heat sink such that, during the testing of the emitter, a probe of the probe card contacts a probe pad for the emitter through an opening in the heat sink.

DETAILED DESCRIPTION

The following detailed description of example implementations refers to the accompanying drawings. The same reference numbers in different drawings may identify the same or similar elements.

In the case of wafer level testing for a top-emitting VCSEL wafer, the top-emitting VCSEL wafer may be placed on an opaque (e.g., metallic) stage that can also serve as a temperature controlled heat sink. Here, because light from an emitter (or an array of emitters) being tested (referred to as a device under test (DUT)) is emitted in a direction away from the stage/heat sink, the heat sink does not interfere with the emitted light. Further, because the top-emitting VCSEL wafer moves with the heat sink, the top-emitting VCSEL wafer may be held by vacuum to the heat sink while probes of a probe card (arranged above the top-emitting VCSEL wafer) are moved from emitter to emitter across the top-emitting VCSEL wafer or the stage holding the wafer translates while the probe card is held stationary.

Wafer level testing of emitters of a bottom-emitting VCSEL wafer presents a number of challenges as compared to wafer level testing of emitters in a top-emitting VCSEL wafer. For example, wafer level testing of emitters in a bottom-emitting VCSEL wafer needs to be performed on a transparent stage (to allow light to pass through the transparent stage). Here, due to light passing through the transparent stage, it is not possible to provide heating or cooling of the bottom-emitting VCSEL wafer directly below (i.e., the transparent stage cannot be used as a heat sink). Further, the transparent stage may need to have a cavity to pull vacuum to hold the bottom-emitting VCSEL wafer to the transparent stage and, as a result, there is no thermal conductivity in a vertical direction (only heat transfer by radiation is possible). Therefore, some temperature regulating functionality (e.g., heating and/or cooling) must be provided on a top side of the bottom-emitting VCSEL wafer. However, electrical contact to emitters of the bottom-emitting VCSEL wafer is also provided on the top side of the wafer, and so temperature regulation of the bottom-emitting VCSEL wafer should be provided in such a way so as not to interfere with the switching of electrical contacts from emitter to emitter across the bottom-emitting VCSEL wafer. One possible solution is to cause temperature controlled air to blow over the bottom-emitting VCSEL wafer. However, such a solution provides temperature regulation for a local area only (e.g., an area near which the temperature controlled air strikes the surface of the bottom-emitting VCSEL wafer) and, therefore, a significant amount of wait time between testing different emitters may be needed when testing across the bottom-emitting VCSEL wafer (e.g., when sample testing is to be performed across the entire bottom-emitting VCSEL wafer).

Some implementations described herein provide techniques and apparatuses associated with a testing device that enables wafer level testing of an emitter array, such as a bottom-emitting VCSEL array, with improved temperature control. In some implementations, the testing device includes a stage associated with holding an emitter wafer during testing of an emitter of the emitter wafer, where the stage is arranged such that light emitted by the emitter during the testing passes through the stage. The testing device may further include a heat sink arranged such that the light emitted by the emitter during the testing is emitted in a direction away from the heat sink, and such that a first surface (e.g., a bottom surface) of the heat sink is near a surface (e.g., a top surface) of the emitter wafer during the testing but does not contact the surface of the emitter wafer. Additionally, the testing device may include a probe card associated with performing the testing of the emitter. Here, the probe card may be arranged over a second surface (e.g., a top surface) of the heat sink such that, during the testing of the emitter, a probe of the probe card contacts a probe pad for the emitter through an opening in the heat sink.

In some implementations, the techniques and apparatuses described herein provide temperature control for an entire bottom-emitting VCSEL wafer during wafer level testing (e.g., rather than providing temperature control for a local area only, as described above), thereby improving the wafer level testing of the bottom-emitting VCSEL wafer. Additional details are provided below.

Notably, while the examples described herein are described in the context of bottom-emitting VCSEL wafers, the techniques and apparatuses described herein (e.g., the temperature control and electrical probing schemes) can be utilized for wafer level testing of other types of emitters, such as lasers diodes that possess a turning-mirror or grating element that directs the beam perpendicular to the chip or wafer surface, light emitting diodes (LEDs) that emit light through a substrate, or the like.

Figure 1:
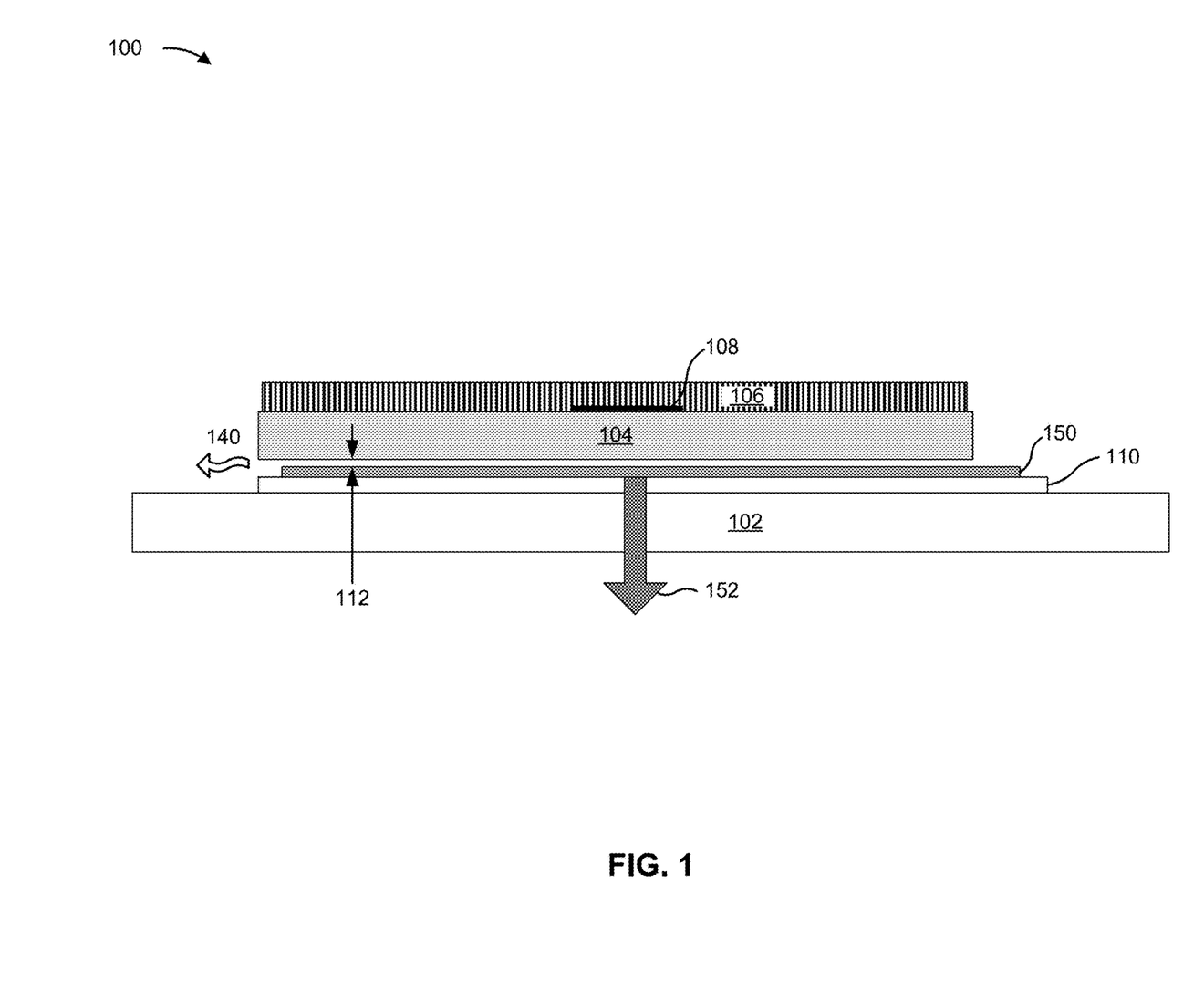
FIG. 1 is a diagram of an example testing device that enables wafer level testing of an emitter array with improved temperature control, as described herein.

FIG. 1 is a diagram of an example testing device 100 that enables wafer level testing of an emitter array with improved temperature control, as described herein. As shown in FIG. 1, example 100 may include a transparent stage 102, a heat sink 104, a temperature control component 106 (optional), a probe card 108, and a carrier 110 (optional). As indicated in FIG. 1, testing device 100 may be used for testing emitters on a wafer 150. In some implementations, the emitters on wafer 150 may be bottom-emitting VCSELs. Alternatively, the emitters on wafer 150 may be lasers diodes that possess a turning-mirror or grating element that directs the beam perpendicular to the chip or wafer surface, LEDs that emit light through a substrate, or another type of emitter. Notably, while the implementations of testing device 100 described below are in the context of testing an emitter on wafer 150 (e.g., a single emitter), these implementations can be equally applied to testing of a group of emitters on wafer 150 (e.g., an array of emitters on wafer 150). That is, the term "emitter," as described in associated with testing device 100, can also be interpreted as a "group of emitters" or "an array of emitters."

Stage 102 includes a component associated with holding, carrying, or otherwise supporting wafer 150 during testing of an emitter of wafer 150. In some aspects, as shown in FIG. 1, stage 102 is arranged such that light 152 emitted by the emitter during the testing passes through stage 102. In some implementations, stage 102 is a transparent stage that allows light 152 to pass through stage 102. In some implementations, as shown in FIG. 1, testing device 100 may optionally include a transparent carrier 110 on which wafer 150 may be arranged during the testing.

In some implementations, the wafer being held by the stage 102 is configured to translate in a direction parallel to a first surface (e.g., a bottom surface) of heat sink 104 in association with testing another emitter of wafer 150. For example, in FIG. 1, stage 102 may be in a first position to enable a first emitter on wafer 150 to be tested by testing device 100, may translate laterally (i.e., left/right in the orientation of FIG. 1 and/or into/out of the plane of the page of FIG. 1) with respect to the bottom surface of heat sink 104 to a second position to permit a second emitter on wafer 150 to be tested, may translate laterally with respect to the bottom surface of heat sink 104 to a third position to permit a third emitter on wafer 150 to be tested, and so on. In some implementations, a control device (not shown) may control movement and positioning of stage 102 during testing of emitters on wafer 150.

Heat sink 104 includes a component associated with providing temperature regulation for wafer 150 during the testing of an emitter on wafer 150. In some implementations, heat sink 104 is arranged such that light 152 emitted by the emitter during the testing is emitted in a direction away from heat sink 104, as shown in FIG. 1. In some implementations, a size of a surface area of a first surface (e.g., the bottom surface) of heat sink 104 (ignoring any openings or channels in the first surface of heat sink 104) may be at least approximately 25% of a size of a surface area of a surface (e.g., a top surface) of wafer 150 (ignoring any openings or channels in the surface of wafer 150). For example, the size of the surface area of the bottom surface of heat sink 104 may match or exceed the size of the surface area of the top surface of wafer 150. In some implementations, the size (e.g., diameter) of heat sink 104 be more than twice the size (e.g., diameter) of wafer 150 so that most or all of wafer 150 remains under heat sink 104 when the DUT is near an edge of wafer 150. In some implementations, heat sink 104 may include one or more openings, one or more channels, and/or one or more recesses. Additional details regarding openings, channels, and recesses of heat sink 104 are provided below.

In some implementations, heat sink 104 is arranged such that the first surface of heat sink 104 is near the surface of wafer 150 during the testing but does not contact the surface of wafer 150. For example, as shown in FIG. 1, heat sink 104 may be arranged such there is a gap 112 between the bottom surface of heat sink 104 and the top surface of wafer 150.

Notably, gap 112 is maintained when stage 102 laterally translates. In some implementations, a height of gap 112 may be less than 2.0 millimeters (mm). For example, the height of gap 112 may be approximately 0.2 mm or less, in some implementations. In some implementations, as indicated in FIG. 1, gap 112 permits a thermally-conductive fluid 140 to flow or be present between the first surface of heat sink 104 and the surface of wafer 150 during the testing. In some implementations, the presence of fluid 140 may provide thermal conduction across gap 112 (e.g., with minimal thermal resistance), while allowing wafer 150 to translate laterally on stage 102 (e.g., so that different emitters across wafer 150 may be probed from the same side as heat sink 104). In some implementations, the fluid may include, for example, air, helium, propylene glycol, glycerol, water, or another type of thermally conductive fluid. Water may be used when relatively high thermal conductivity is needed (e.g., 0.6 watts per meter-Kelvin (W/mK)) and and/or easy removal is desired. A solution of propylene glycol 60%/water 40% or a solution of 70% glycerol/30% water may be used when a relatively wide range of operating temperatures is needed. In some implementations, the thermal conductivity of fluid 140 may permit a flow of fluid 140 to be minimal (e.g., possibly zero pumping for a liquid) such that conductive heat transfer is used (i.e., such that little or no convective transfer is needed).

In some implementations, the close proximity of heat sink 104 to wafer 150 permits comparatively less air flow than would otherwise be required to heat/cool the entirety of wafer 150. This means that a risk of vibration caused by the flow of fluid 140 is reduced (due to the comparatively lower amount of fluid flow). In some implementations, pressure from fluid 140 may serve to press down on wafer 150, thereby flattening wafer 150 on stage 102 (or carrier 110). In some implementations, the pressure provided by fluid 140 may obviate a need to flatten wafer 150 to stage 102 (or carrier 110) with vacuum.

In some implementations, heat sink 104 is configured to translate in a direction parallel to the surface of stage 102 in association with testing another emitter of wafer 150. For example, in FIG. 1, heat sink 104 may be in a first position to enable a first emitter on wafer 150 to be tested by testing device 100, may translate laterally (i.e., left/right in the orientation of FIG. 1 and/or into/out of the plane of the page of FIG. 1) with respect to stage 102 to a second position to permit a second emitter on wafer 150 to be tested, may translate laterally with respect to stage 102 to a third position to permit a third emitter on wafer 150 to be tested, and so on. In some implementations, the control device (not shown) may control movement and positioning of heat sink 104 during testing of emitters on wafer 150. In some implementations, one or both of heat sink 104 and stage 102 may be configured for lateral translation in association with testing different emitters on wafer 150. In some implementations, heat sink 104 may be configured to be moved vertically down (e.g., with probes of probe card 108). In some implementations, to reduce vibration and maximize conductivity, heat sink 104 may be configured for only lateral translation (e.g., while the probes move up and down from DUT to DUT).

Temperature control component 106 includes an optional component associated with controlling, regulating, or otherwise managing a temperature of heat sink 104. For example, temperature control component 106 may include a thermo-electric cooler or another means by which the temperature of heat sink 104 can be controlled, regulated, or otherwise managed (e.g., a fluid flow within heat sink 104).

In some implementations, the control device (not shown) may control operation of temperature control component 106 in association with controlling, regulating, or otherwise managing the temperature of heat sink 104.

Probe card 108 includes a component associated with performing the testing of the emitter on wafer 150. In some implementations, as shown in FIG. 1, probe card 108 may be arranged over a second surface (e.g., the top surface) of heat sink 104 such that, during the testing of the emitter, a probe of probe card 108 contacts a probe pad for the emitter through an opening in heat sink 104. In some implementations, the control device (not shown) may control operation of probe card 108 and/or may receive information from probe card 108 in association with the testing of the emitter on wafer 150. In some implementations, probe card 108 may be placed within a recess in heat sink 104, as described below.

Figure 2A:
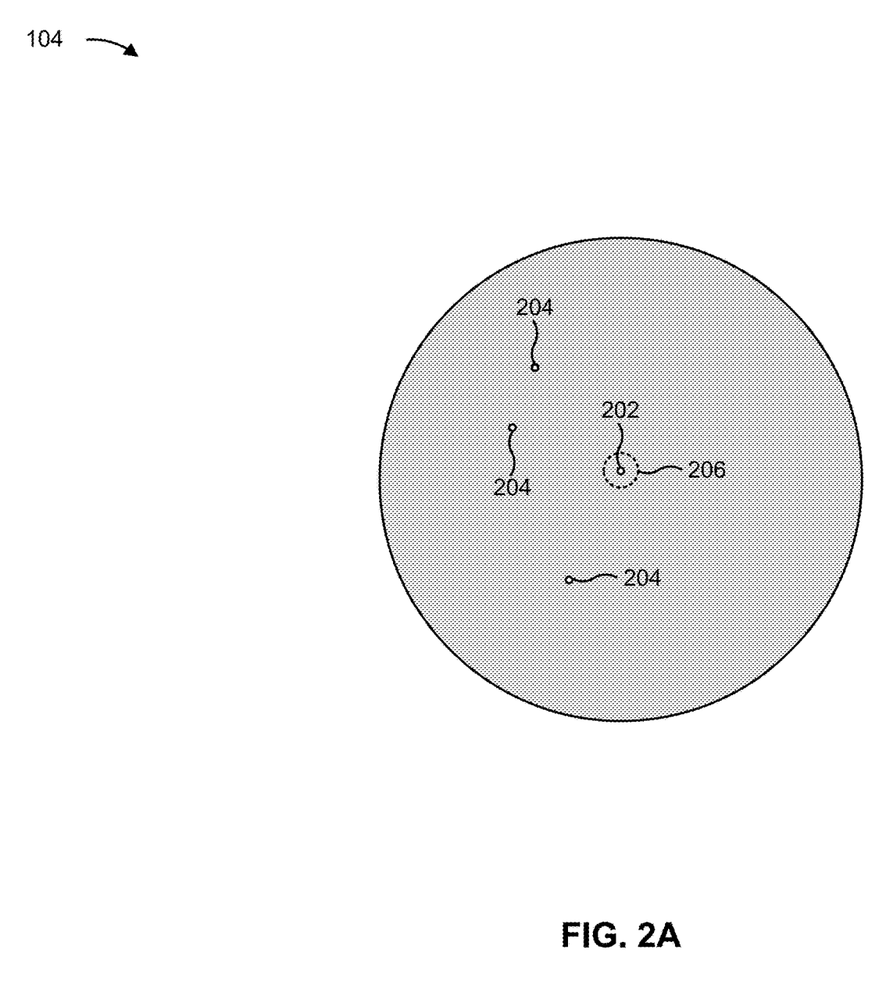
FIGS. 2A and 2B are diagrams of an example heat sink included in a testing device that enables wafer level testing of an emitter array with improved temperature control, as described herein.
Figure 2B:
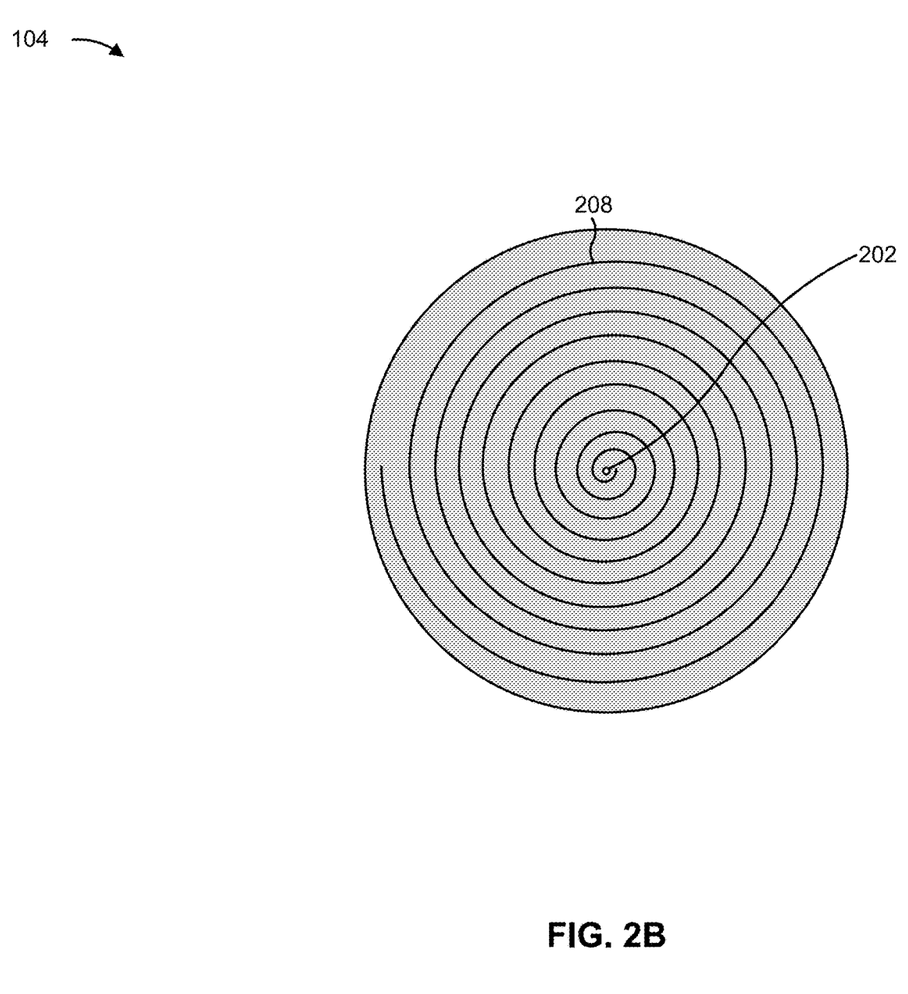

As indicated above, in some implementations heat sink 104 may include one or more openings, one or more channels, and/or one or more recesses. FIGS. 2A and 2B are diagrams of an example of such a heat sink 104. FIG. 2A is a diagram of an example front side of heat sink 104 (corresponding to a top surface of heat sink 104 in FIG. 1), while FIG. 2B is a diagram of an example back side of heat sink 104 (corresponding to the bottom surface of heat sink 104 in FIG. 1).

In some implementations, heat sink 104 may include an opening to permit a probe of probe card 108 to contact a probe pad for an emitter on wafer 150 during testing of the emitter. In FIGS. 2A and 2B, the opening that permits the probe of probe card 108 to contact a probe pad for an emitter during testing is identified as opening 202. In some implementations, opening 202 may be at or near a center of heat sink 104, as shown in FIGS. 2A and 2B. In some implementations, opening 202 may have a size (e.g., a diameter) that is less than approximately 2.0 mm. Notably, the size of opening 202 may be small in comparison to a size of wafer 150 (e.g., a diameter of wafer 150, which may be, for example, approximately 150 mm). Thus, the relatively small size of opening 202 allows most of the top surface of wafer 150 to be placed in close proximity to heat sink 104, as described above.

In some implementations, as shown in FIG. 2A, heat sink 104 may include one or more openings 204. The one or more openings 204 (not shown in FIG. 2B) may be associated with allowing fluid 140 to flow or be present between the first surface of heat sink 104 and the surface of wafer 150 during the testing. In some implementations, opening 204 may have a size (e.g., a diameter) that is less than approximately 2.0 mm. Notably, the size of a given opening 204 may be small in comparison to a size of wafer 150, thereby allowing most of the top surface of wafer 150 to be placed in close proximity to heat sink 104, as described above. Notably, openings 204 are optional and, in some implementations, heat sink 104 may not include any openings 204.

In some implementations, as further shown in FIG. 2A, heat sink 104 (e.g., the top surface of heat sink 104) may include a recess 206 associated with enabling probe card 108 to contact the probe pad for the emitter through opening 202 in heat sink 104. In some implementations, probe card 108 may be arranged within recess 206 (e.g., to permit probe card 108 to be sufficiently close to the DUT to allow a probe to reach the DUT).

In some implementations, as shown in FIG. 2B, heat sink 104 (e.g., the bottom surface of heat sink 104) may include one or more channels 208. The one or more channels 208 may be associated with allowing fluid 140 to flow or be present between the first surface (e.g., the bottom surface) of heat sink 104 and the surface (e.g., the top surface) of wafer 150 during the testing. In some implementations, the one or more channels 208 may form a spiral pattern (e.g., as shown in FIG. 2B), a radial pattern, a polygonal pattern, a random pattern, or another type of pattern. Notably, channels 208 are optional and, in some implementations, heat sink 104 may not include any channels 208.

Figure 3:
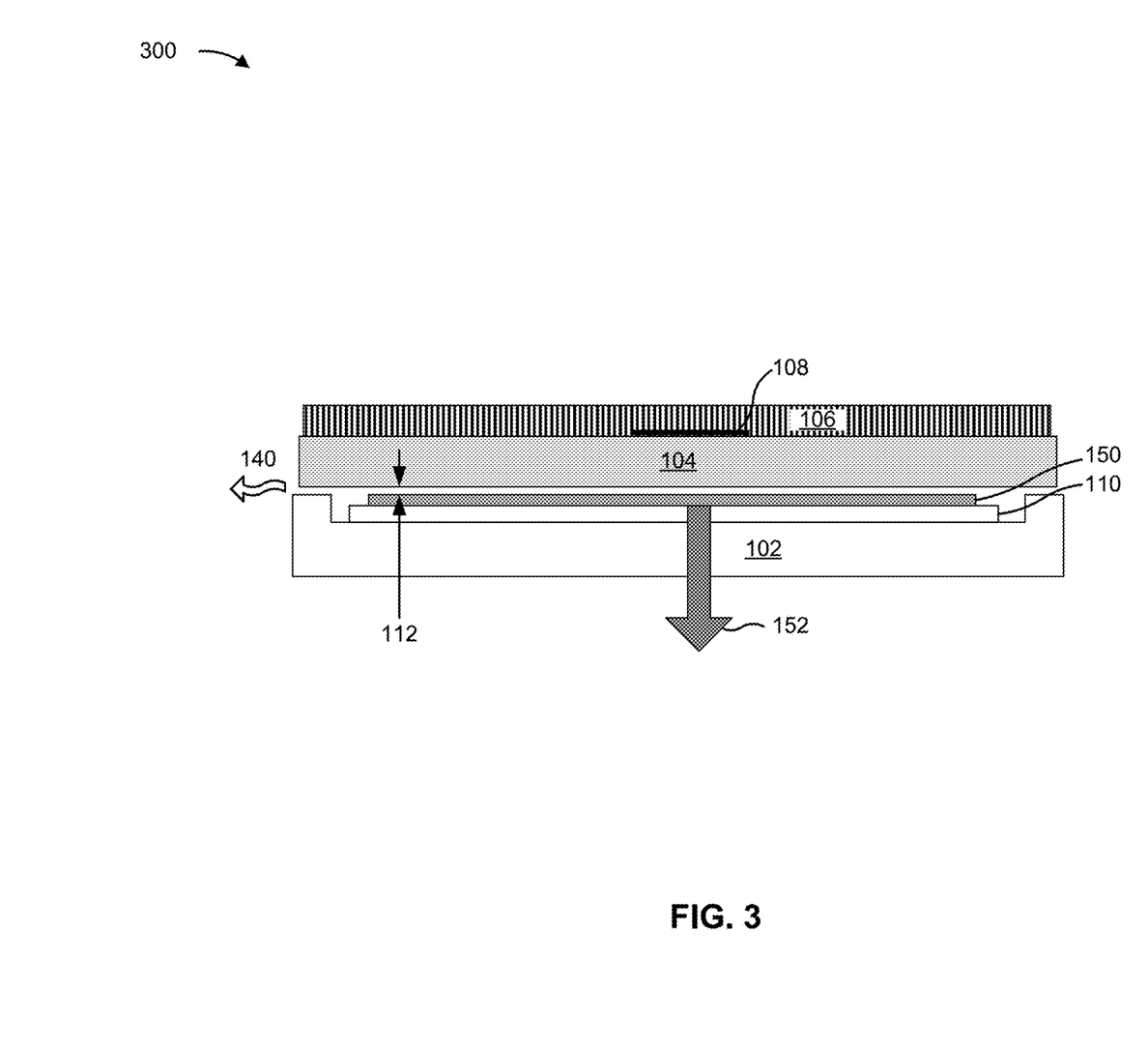
FIG. 3 is a diagram of another example testing device that enables wafer level testing of an emitter array with improved temperature control, as described herein.

In some implementations, stage 102 may include a recess in which wafer 150 is placed for the testing of an emitter on wafer 150. FIG. 3 is a diagram of a testing device 300 including a stage 102 with a recess in which wafer 150 is placed for testing. In some implementations, the recess within stage 102 may be sized such that, when wafer 150 is placed within the recess (e.g., on carrier 110), gap 112 is substantially constant across every lateral position of composite surface of wafer 150/stage 102. The substantially constant gap 112 may serve to increase consistency of the flow of fluid 140 across stage 102 as wafer 150 is laterally translated during testing of emitters on wafer 150.

As indicated above, FIGS. 1, 2A, 2B, and 3 are provided as examples. Other examples may differ from what is described with regard to FIGS. 1, 2A, 2B, and 3. The number and arrangement of components and elements shown in FIGS. 1, 2A, 2B, and 3 are provided as an example. In practice, there may be additional components and/or elements, fewer components and/or elements, different components and/or elements, or differently arranged components and/or elements than those shown in FIGS. 1, 2A, 2B, and 3. Furthermore, two or more components and/or elements shown in FIGS. 1, 2A, 2B, and 3 may be implemented within a single component and/or element, or a single component and/or element shown in FIG. 1, 2A, 2B, or 3 may be implemented as multiple, distributed components and/or elements.

Additionally, or alternatively, a set of components and/or elements (e.g., one or more components, one or more elements) shown in FIG. 1, 2A, 2B, or 3 may perform one or more functions described as being performed by another set of components and/or elements shown in FIG. 1, 2A, 2B, or 3.

Figure 4:
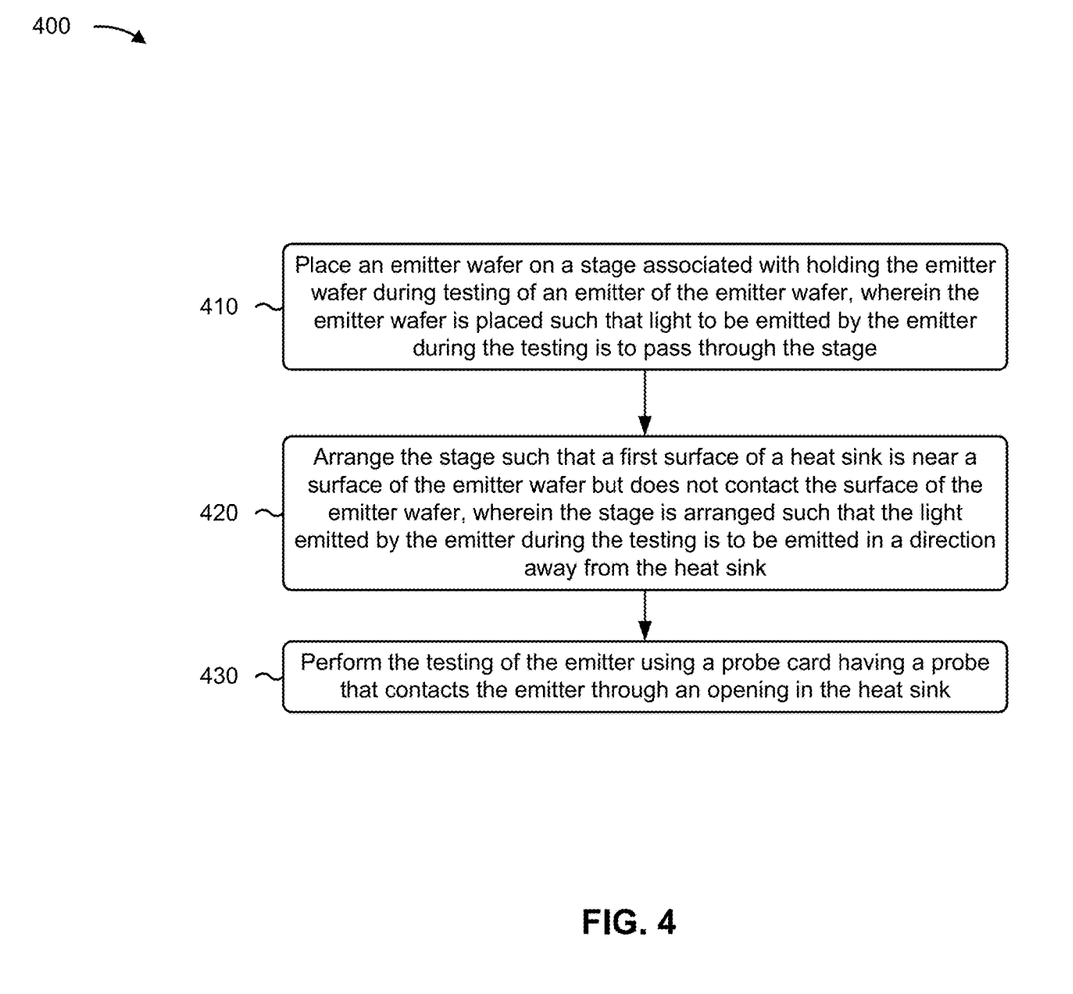
FIG. 4 is a flow chart of an example process relating to wafer level testing of an emitter array with improved temperature control, as described herein.

FIG. 4 is a flow chart of an example process 400 relating to wafer level testing of an emitter array with improved temperature control, as described herein.

As shown in FIG. 4, process 400 may include placing an emitter wafer on a stage associated with holding the emitter wafer during testing of an emitter of the emitter wafer (block 410). For example, a bottom-emitting VCSEL wafer may be placed on a stage associated with holding the bottom-emitting VCSEL wafer during testing of an emitter of the bottom-emitting VCSEL wafer, as described above. In some implementations, the emitter wafer is placed such that light to be emitted by the emitter during the testing is to pass through the stage.

As further shown in FIG. 4, process 400 may include arranging the stage such that a first surface of a heat sink is near a surface of the emitter wafer but does not contact the surface of the emitter wafer (block 420). For example, the stage may be arranged such that a first surface of a heat sink is near a surface of the bottom-emitting VCSEL wafer but does not contact the surface of the bottom-emitting VCSEL wafer, as described above. In some implementations, the stage is arranged such that the light emitted by the emitter during the testing is to be emitted in a direction away from the heat sink.

As further shown in FIG. 4, process 400 may include performing the testing of the emitter using a probe card having a probe that contacts a probe pad for the emitter through an opening in the heat sink (block 430). For example, the testing of the emitter may be performed using a probe card having a probe that contacts a probe pad for the emitter through an opening in the heat sink, as described above.

Process 400 may include additional implementations, such as any single implementation or any combination of implementations described below and/or in connection with one or more other processes described elsewhere herein.

In some implementations, a gap between the first surface of the heat sink and the surface of the emitter wafer during the testing is less than 2.0 millimeters.

In some implementations, process 400 includes causing a thermally-conductive fluid (e.g., air, helium, propylene glycol, glycerol, water, or the like) to flow or be present between the first surface of the heat sink and the surface of the emitter wafer during the testing.

In some implementations, process 400 includes translating the stage in a direction parallel to the first surface of the heat sink in association with testing another emitter of the emitter wafer.

In some implementations, the heat sink includes one or more other openings associated with allowing a fluid to flow or be present between the first surface of the heat sink and the surface of the emitter wafer during the testing.

In some implementations, the heat sink includes a recess associated with enabling the probe card to contact the probe pad for the emitter through the opening in the heat sink.

In some implementations, the heat sink includes one or more channels associated with allowing a fluid to flow or be present between the first surface of the heat sink and the surface of the emitter wafer during the testing.

In some implementations, the emitter wafer is placed within a recess in the stage.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "over," "under," "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees, rotated 180 degrees, or at other orientations) and the spatially relative descriptors used herein may likewise be interpreted accordingly.

What is claimed is:

1. A testing device, comprising:
    a stage configured to hold a bottom-emitting vertical-cavity surface-emitting laser (VCSEL) wafer during testing of an emitter of the bottom-emitting VCSEL wafer,
        wherein the stage is arranged such that light emitted by the emitter, during the testing of the emitter, passes through the stage;
    a heat sink for the bottom-emitting VCSEL wafer during the testing of the emitter,
        wherein the heat sink is arranged such that the light emitted by the emitter, during the testing of the emitter, is emitted in a direction away from the heat sink, and
        wherein the heat sink is arranged such that a bottom surface of the heat sink faces and is spaced apart from a top surface of the bottom-emitting VCSEL wafer during the testing of the emitter; and
    a probe card configured to perform the testing of the emitter,
        wherein a bottom surface of the probe card is arranged over a top surface of the heat sink such that, during the testing of the emitter, a probe of the probe card contacts a probe pad for the emitter through an opening in the heat sink.

2. The testing device of claim 1, wherein a gap between the bottom surface of the heat sink and the top surface of the bottom-emitting VCSEL wafer, during the testing of the emitter, is less than 2.0 millimeters.

3. The testing device of claim 1, wherein a thermally-conductive fluid either flows or is present between the bottom surface of the heat sink and the top surface of the bottom-emitting VCSEL wafer during the testing of the emitter.

4. The testing device of claim 3, wherein the thermally-conductive fluid includes at least one of air, helium, propylene glycol, glycerol, or water.

5. The testing device of claim 1, wherein the stage is configured to translate in a direction parallel to the bottom surface of the heat sink in association with testing another emitter of the bottom-emitting VCSEL wafer.

6. The testing device of claim 1, wherein a size of the opening in the heat sink is less than or equal to 2.0 millimeters.

7. The testing device of claim 1, wherein the heat sink includes one or more other openings that are configured to allow a fluid to either flow or be present between the bottom surface of the heat sink and the top surface of the bottom-emitting VCSEL wafer during the testing of the emitter.

8. The testing device of claim 1, wherein the heat sink includes a recess that is configured to enable the probe card to contact the probe pad for the emitter through the opening in the heat sink.

9. The testing device of claim 1, wherein the heat sink includes one or more channels that are configured to allow a fluid to either flow or be present between the bottom surface of the heat sink and the top surface of the bottom-emitting VCSEL wafer during the testing of the emitter.

10. The testing device of claim 1, wherein the stage includes a recess in which the bottom-emitting VCSEL wafer is to be placed for the testing of the emitter.

11. A method, comprising:
    placing a bottom-emitting vertical-cavity surface-emitting laser (VCSEL) wafer on a stage that is configured to hold the bottom-emitting VCSEL wafer during testing of an emitter of the bottom-emitting VCSEL wafer,
        wherein the bottom-emitting VCSEL wafer is placed such that light to be emitted by the emitter, during the testing of the emitter, is to pass through the stage;
    arranging the stage such that a bottom surface of a heat sink faces and is spaced apart from a top surface of the bottom-emitting VCSEL wafer,
        wherein the stage is arranged such that the light emitted by the emitter, during the testing of the emitter, is to be emitted in a direction away from the heat sink;
    arranging a probe card such that a bottom surface of the probe card is arranged over a top surface of the heat sink and a probe of the probe card extends through an opening in the heat sink to contact a probe card for the emitter; and
    performing the testing of the emitter using the probe card.

12. The method of claim 11, wherein a gap between the bottom surface of the heat sink and the top surface of the bottom-emitting VCSEL wafer during the testing is less than 2.0 millimeters.

13. The method of claim 11, further comprising:
    causing a thermally-conductive fluid to either flow or be present between the bottom surface of the heat sink and the top surface of the bottom-emitting VCSEL wafer during the testing of the emitter.

14. The method of claim 11, further comprising:
    translating the stage in a direction parallel to the bottom surface of the heat sink in association with testing another emitter of the bottom-emitting VCSEL wafer.

15. The method of claim 11, wherein the heat sink includes one or more other openings that are configured to allow a fluid to either flow or be present between the bottom surface of the heat sink and the top surface of the bottom-emitting VCSEL wafer during the testing of the emitter.

16. The method of claim 11, wherein the heat sink includes a recess that is configured to enable the probe card to contact the probe pad for the emitter through the opening in the heat sink.

17. The method of claim 11, wherein the heat sink includes one or more channels that are configured to allow a fluid to either flow or be present between the bottom surface of the heat sink and the top surface of the bottom-emitting VCSEL wafer during the testing of the emitter.

18. The method of claim 11, wherein the bottom-emitting VCSEL wafer is placed within a recess in the stage.

19. A device, comprising:
   a heat sink for an emitter wafer during testing of an emitter of the emitter wafer,
      wherein the heat sink is arranged such that light emitted by the emitter, during the testing of the emitter, is emitted in a direction away from the heat sink, and
      wherein the heat sink is arranged such that a bottom surface of the heat sink faces and is spaced apart from a top surface of the emitter wafer during the testing of the emitter; and
   a probe card that is configured to perform the testing of the emitter,
      wherein a bottom surface of the probe card is arranged over a top surface of the heat sink such that, during the testing of the emitter, a probe of the probe card contacts a probe pad for the emitter through an opening in the heat sink.

20. The device of claim 19, further comprising a stage that is configured to hold the emitter wafer during the testing of the emitter,
   wherein the stage is arranged such that the light emitted by the emitter during the testing of the emitter, passes through the stage.

* * * * *